(12) United States Patent
Martin

(10) Patent No.: US 9,275,817 B2
(45) Date of Patent: Mar. 1, 2016

(54) PARTICLE-BEAM COLUMN CORRECTED FOR BOTH CHROMATIC AND SPHERICAL ABERRATION

(71) Applicant: Frederick Wight Martin, North Stratford, NH (US)

(72) Inventor: Frederick Wight Martin, North Stratford, NH (US)

(*) Notice: Subject to any disclaimer, the term of this patent is extended or adjusted under 35 U.S.C. 154(b) by 0 days.

(21) Appl. No.: 13/849,496

(22) Filed: Mar. 23, 2013

(65) Prior Publication Data
US 2013/0264477 A1 Oct. 10, 2013

Related U.S. Application Data

(60) Provisional application No. 61/686,549, filed on Apr. 9, 2012.

(51) Int. Cl.
| | | |
|---|---|---|
| H01J 37/145 | (2006.01) | |
| H01J 3/22 | (2006.01) | |
| H01J 37/141 | (2006.01) | |
| H01J 37/153 | (2006.01) | |
| H01J 3/12 | (2006.01) | |

(52) U.S. Cl.
CPC ... *H01J 3/22* (2013.01); *H01J 3/12* (2013.01); *H01J 37/141* (2013.01); *H01J 37/145* (2013.01); *H01J 37/153* (2013.01); *H01J 2237/04926* (2013.01); *H01J 2237/1534* (2013.01); *H01J 2237/31749* (2013.01)

(58) Field of Classification Search
CPC ............... H01J 2237/04926; H01J 2237/1534; H01J 37/145; H01J 37/141; H01J 2237/31748; H01J 3/12; H01J 3/22; H01J 37/153

USPC .................................... 250/396 R, 396 ML
See application file for complete search history.

(56) References Cited

U.S. PATENT DOCUMENTS

| | | | | |
|---|---|---|---|---|
| 4,590,379 | A | * | 5/1986 | Martin ................. H01J 37/1474 250/396 ML |
| 4,962,313 | A | * | 10/1990 | Rose ..................... H01J 37/153 250/310 |
| 5,369,279 | A | * | 11/1994 | Martin .................. H01J 37/145 250/396 ML |
| 6,646,267 | B1 | | 11/2003 | Haider |
| 6,723,997 | B2 | | 4/2004 | Matsuya |
| 6,770,887 | B2 | | 8/2004 | Krivanek |
| 7,321,118 | B2 | | 1/2008 | Ward |
| 7,378,667 | B2 | | 5/2008 | Henstra |
| 7,414,243 | B2 | | 8/2008 | Ward |
| 7,485,873 | B2 | | 2/2009 | Ward et al. |
| 7,488,952 | B2 | | 2/2009 | Ward et al. |
| 7,495,232 | B2 | | 2/2009 | Ward et al. |
| 7,504,679 | B2 | | 3/2009 | Ward et al. |
| 7,511,279 | B2 | | 3/2009 | Ward et al. |
| 7,511,280 | B2 | | 3/2009 | Ward et al. |
| 7,518,122 | B2 | | 4/2009 | Ward et al. |
| 7,521,693 | B2 | | 4/2009 | Ward et al. |
| 7,554,096 | B2 | | 6/2009 | Ward et al. |

(Continued)

*Primary Examiner* — Wyatt Stoffa

(57) ABSTRACT

An objective lens for use in probe-forming particle-optical columns such as focused ion beam equipment, scanning electron microscopes, and helium microscopes is described. It comprises two interleaved (quadrupole/octopole) lenses and two or three ancillary octopole lenses, and is capable of simultaneous compensation of spherical (Cs) and chromatic (Cc) aberrations of the objective lens alone or of the complete particle-optical column. Additional apparatus comprising a gridded aperture and position-sensitive detector is specified, together with a method to measure and minimize all of the five independent third-order aberration coefficients of the objective lens.

21 Claims, 2 Drawing Sheets

(56) References Cited

U.S. PATENT DOCUMENTS

| | | |
|---|---|---|
| 7,554,097 B2 | 6/2009 | Ward et al. |
| 7,557,358 B2 | 7/2009 | Ward et al. |
| 7,557,359 B2 | 7/2009 | Ward et al. |
| 7,605,378 B2 * | 10/2009 | Honda .................. H01J 37/153 250/310 |
| 7,763,862 B2 | 7/2010 | Hosokawa |
| 7,825,377 B2 * | 11/2010 | Kawasaki .............. B82Y 10/00 250/306 |
| 7,989,776 B2 | 8/2011 | Muller |
| 8,129,693 B2 | 3/2012 | Preikszas |
| 8,178,850 B2 | 5/2012 | Sawada |
| 8,389,951 B2 | 3/2013 | Sawada |
| 2004/0004192 A1 | 1/2004 | Krivanek |
| 2004/0227099 A1 * | 11/2004 | Matsuya .................. H01J 37/28 250/398 |
| 2005/0017194 A1 * | 1/2005 | Matsuya ................ H01J 37/153 250/396 R |
| 2005/0156117 A1 * | 7/2005 | Uno ........................ H01J 37/28 250/396 R |
| 2005/0189496 A1 * | 9/2005 | Uno ........................ H01J 37/28 250/396 R |
| 2007/0114408 A1 * | 5/2007 | Honda .................. H01J 37/153 250/310 |
| 2007/0164228 A1 * | 7/2007 | Frosien ................ H01J 37/153 250/396 ML |

* cited by examiner

PARTICLE-BEAM COLUMN CORRECTED FOR BOTH CHROMATIC AND SPHERICAL ABERRATION

FIELD OF THE INVENTION

The invention pertains to the field of ion optics, as it is used in equipment for forming finely focused ion beams, used generally in fields such as microfabrication and microanalysis, such as ion implantation in semiconductors, micromachining of materials by ion sputtering, ion beam lithography, secondary ion microanalysis, scanning ion microscopy, and helium microscopy. It may be useful in electron optics, for use in the probe-forming lenses of scanning electron microscopes and scanning transmission electron microscopes.

BACKGROUND OF THE INVENTION

As shown in FIG. 1, focused ion beam systems typically contain a needle type source 1, a condenser lens 2, a mid-column deflector system 3, and an objective lens system 4. The condenser lens system typically contains electrodes 8, 9, 10 forming individual lenses 5, 6 located inside a vacuum chamber 7. The objective lens forms a finely focused beam into a spot 12. Electron microscopes have achieved atomic scale resolution, but instruments based on ion beams have not been able to achieve such small focii. The typical helium microscope consists of a needle-type ion source and round electrostatic lenses. These lenses suffer from the defect of chromatic aberration, which causes enlargement of the focal spot as the lens aperture is opened. At the aperture size where the brightness limit (for 0.5 pA current) and spherical aberration each contribute 0.1 nm of aberration, chromatic aberration dominates with a contribution of 1.0 nm [R. Hill, F. H. M. Faridur Rahman, Nucl. Instr. and Meth. in Phys. Res. A645 (2011) 96: FIG. 1]. Chromatic aberration also dominates the aberration of typical focused ion beam systems based on electrostatic objective lenses, causing the current available in a focal spot of fixed size to fall as the cube of the ion energy.

Fortunately if round lenses are not used, an achromatic system can be configured sing an objective lens consisting of a pair 14, 16 of interleaved quadrupole lenses of the Kelman-Yavor type. These lenses have 8 poles, with alternating electric and magnetic poles, and if the magnetic poles are electrically isolated [Martin and Goloskie, Applied Physics Letters 40 (1982) 191], they can be excited with voltages that create cos(t) [dipole}, cos(2t) [quadrupole}, cos(3t) [hexapole} or cos(4t) [octopole} potentials. The magnetic poles produce a magnetic force field (q v×B) which is collinear with the electric force field (qE) at each point inside the lens, oppositely directed to the electric force, and twice its magnitude. Under these conditions the variation of the focal length with ion energy is zero, and chromatic aberration of the lens is eliminated. Two such interleaved lenses adjusted so that their principal sections are in the same plane constitute an objective lens focusing in both x and y principal sections. When two such lenses 14, 16 are combined with an electrostatic condensing lens 2 to form a particle-optical column, the quadrupoles may also be operated at different electric to magnetic ratios which cancel the chromatic aberration of the whole column rather than only the lenses [Martin PCT/US94/13358].

As pointed out by Crewe [Crewe, Eggenberger, Welter & Wall, J. Appl. Phys 38 (1967) 4257], the unequal magnifications of a doublet in its two principal sections do not matter for a scanning microscope, where the squareness of the image is determined by the scanning system rather than the probe-forming objective lens. This is particularly true for the atom-emitter source used in helium microscopes, where the geometrical image of the source is likely to be smaller than the aberrations caused by the objective lens.

Both round lenses and quadrupole lenses suffer from aperture aberrations. In a round lens the diameter of the focal spot increases with the cube of the aperture radius, rather than with the linear increase characteristic of chromatic aberration, and has a single "spherical" aberration coefficient Cs. A perfectly symmetrical quadrupole lens has three intrinsic coefficients A, C, E of the form $$x_3 = Aa^3 + 3Cab^2, \qquad (1)$$

$$y_3 = 3Ca^2b + Eb^2 \qquad (2)$$

where $(x_3, y_3)$ is the aberration at the image, and $(a,b)$ are the paraxial angles of convergence of rays to the image (in effect a measure of the diameter of the beam in the lens aperture).

The usefulness of all types of lenses is limited by the mechanical tolerances with which they can be manufactured. These tolerances produce parasitic aberrations which add to the intrinsic aberrations at the focus. Round lenses are finished with lapping compound and measured on air-bearing rotary tables [Orloff, Utlaut, and Swanson, isbn 0-306-47350-x (Kluwer, 2003, p. 163]. Even then they require stigmation, which involves adding dipole and quadrupole potentials to the mid-column deflectors 11,13 located between the ion source and the objective lens (ibid., p 161). In quadrupole lenses the tolerance on placement of the individual poles corresponds to the ellipticity of round lenses. For a single quadrupole lens, an estimate of the 3rd-order parasitic aberration coefficient G produced when the four poles deviate by amounts P from the average radius R is $$G = 4P(T/R)^3, \qquad (3)$$

where T is the throw distance to one of its astigmatic line images. The aberration itself may be estimated as $$x_3 = Gb^3 = 4P(T/R)^3(dR/T)^3 = 4P(dR/R)^3 \qquad (4)$$

where b=dR/T is the semi-angle of convergence of the beam at its focus, when the beam occupies a fraction dR/R of the lens radius. For a typical tolerance P=1 micron and dR/R=0.1, the parasitic aberration is thus 1 nanometer. Apparently the lens must be stopped down to limit parasitic aberrations, and the benefits of chromatic correction are therefore limited.

The 8 poles of an interleaved lens can be used to eliminate this problem by introducing compensation of its 3rd order parasitic aberrations. The combined effect of 8 deviations is to produce an octopole potential which may be at an arbitrary rotational angle around the lens axis, rather than being aligned with the principal sections of the quadrupole lens. The misalignment can be described as a sum of a "normal octopole" of unknown magnitude with radial form cos(4t) and its maxima lying in the principal sections of the quadrupole lens, and a second "skew octopole" of unknown magnitude with radial form sin(4t) and a rotation by 22.5 degrees with respect to the normal one. For the quadrupole doublet, there are thus four unknown octopole strengths (Uoc Uos) and (Doc, Dos) where U and D represent the upstream and downstream lenses and c,s the cosine and sine terms.

By computing the deflections caused by these fields it can be shown [Martin and Goloskie, Nuclear Instruments and Methods B104 (1995) 59-63] that the quadrupole doublet has five third-order coefficients A thru E with the form $$x_3 = Aa^3 + 3Ba^2b + 3Cab^2 + Db^3 = (1.0a^3 - 0.3a^2b + 2.4ab^2 + 21.8b^3)v^4 \quad (5)$$

$$y_3 = Ba^3 + 3Ca^2b + 3Dab^2 + Eb^3 = (-0.3a^3 + 2.4a^2b + 21.8ab^2 - 238b^3)v^4 \quad (6)$$

where A, C, E result from the normal octopole and B, C from the skew one. The numerical values listed above are relative strengths for four equal parasites in a lens of typical dimensions. These relative values are computable functions of the unknown strengths, for example $$\langle x/ab^2 \rangle = 3C = -3(Uoc/(p^2q^2) - Doc)v^4 \quad (7)$$

$$\langle y/b^3 \rangle = E = -(Uoc/q^4 - Doc)v^4 \quad (8)$$

where v is the final object distance from the downstream lens and p,q are the run-out (p>1) and run-in (q<1) ratios of rays in the x and y sections. These relations show that D and E are the dominant coefficients, and that the upstream lens with octopole strengths (Uoc, Uos) is the major source of aberrations.

As was written in 1970, "One of the main mechanical problems of quadrupole systems arises from the large number of pole pieces or electrodes that must be aligned; it is clear that if all the octopole effects could be obtained by exciting the electrostatic lenses asymmentrically . . . this problem would be greatly simplified" [Hawkes, Quadrupoles in Electron Lens Design, (Academic Press, NY 1970): p. 353]. It is an object of the present invention to show how regular symmetric (rather than asymmetric) excitations can be applied to eliminate parasitic aberrations, and thereby obtain improved resolution from quadrupole lenses.

BRIEF SUMMARY OF THE INVENTION

The two interleaved lenses of a quadrupole doublet objective lens in a focused ion beam column are further excited to trim the normally oriented octopole field in each lens to zero and thereby zero the 3 normal aberration coefficients of the doublet. Two additional octopole lenses of skew orientation are required to cancel the remaining 2 skew coefficients of the doublet. Addition of a third octopole lens with normal orientation allows correction of the spherical aberration of the ion source, thereby simultaneously canceling both the chromatic and $3^{rd}$-order aperture aberrations of the entire column Aberrations are measured rapidly in place using a gridded specimen to define rays and a position-sensitive detector to display aberration patterns. High magnification of the aberrations is obtained if the detector is located at the focal plane of a projector lens. Adjustment of normal coefficients A, C, E of the objective lens proceeds independently of coefficients B and D. When correction using two octopole lenses is involved, adjustment of one coefficient of the objective lens to zero may be obtained by using the proper lens, and adjustment of a second coefficient by using the two lenses in the proper ratio of strengths. When 3 lenses are involved, an iterative approximation may be used to set the 3 normal coefficients of the complete column to zero. Measurement in place thus corrects unavoidable parasitic aberrations which otherwise limit quadrupole lenses to focii as large as the mechanical error in pole placement, and enables use of achromatic and octopole techniques at smaller resolutions than otherwise would be possible.

DETAILED DESCRIPTION

Figure 2:
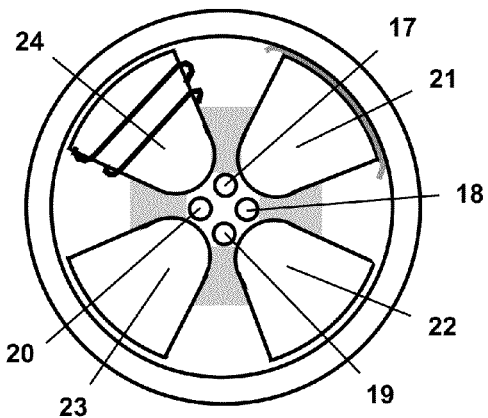
FIG. 2. shows a cross section of an interleaved quadrupole lens

In order to correct the parasitic octopoles of normal orientation in an interleaved quadrupole lens 14, a common voltage J can be applied to its four insulated magnetic poles 17-20 as shown in FIG. 2, and a common voltage of opposite polarity K to its four electrodes 21-24. Because the insulated magnetic poles have both magnetic and electric function, a single lens can be used instead of two lenses, simplifying problems of alignment and construction. Voltage can be applied by voltage-dividing resistors from a single source voltage, or by individual amplifiers driven by digital-to-analog converters under a common computer program, or by any similar means. The means of applying octopole voltages should allow superposition of other modes, and should allow common source voltages J, K of either positive or negative polarity. For this purpose a digital-to-analog converter and associated amplifier may be connected to each pole, and the superposition caused by digital instructions, rather than by a hardwired resistor network to various source voltages for other modes. The octopole voltages should be adjusted so that the potential Vo on the axis is zero, but a normal octopole potential Vo+Uoc $(r/Ro)^4 \cos(4t)$ still occurs if this condition is not arranged, at the expense of end effects. Thus one of the common source voltages J or K for octopole excitation can be zero.

Using measurements of the aberrations as described below, the normal octopoles in the two lenses of a quadrupole doublet can be set so that Uoc=Doc=0 in Eq. (8) and similar expressions, thereby setting A=C=E=0 in Eqs. (5, 6). These adjustments do not affect Uos, Dos, B, or D, that is, they have the property of being orthogonal to them.

Also the two adjustments cause the three coefficients A, C and E to go to zero simultaneously. If correction were not available to null the intrinsic and parasitic octopoles at their sources inside the interleaved insulated-pole lenses, it would take 3 external lenses with normal orientation to cancel the 3 normal coefficients introduced by the imperfect lenses. Thus use of the insulated, interleaved structure achieves a considerable simplification, eliminating the need for three auxiliary external lenses with a total of 24 poles.

Similar technique cannot be utilized for the skew octopoles, because the interleaved lenses have no electrodes which can set potentials 22.5 degrees from the principal sections as required t generate a potential with the form sin(4t). Therefore two more skew-oriented lenses are required to cancel the two coefficients B and D. These may be located anywhere in the optical system.

Figure 3:
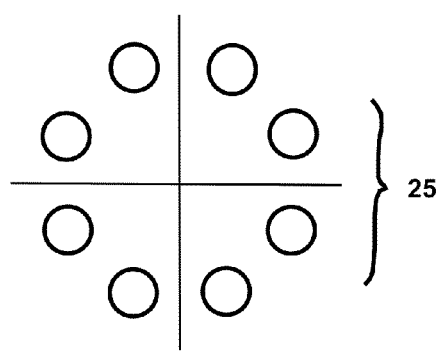
FIG. 3 shows a cross section of a skew octopole lens
Figure 4:
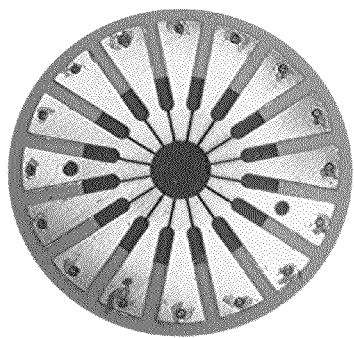
FIG. 4 shows a 16-pole lens capable of operating as a skew or normal octopole

A useful choice is to combine them with the beam deflection systems. For example one skew octopole with voltage Pos can be incorporated in a post-lens electrostatic deflector system 25, comprising 8 poles in skew orientation, such that two adjacent poles lie on either side of the principal sections as shown in FIG. 3. When two such adjacent poles are excited with the same voltage, and the diametrically opposite ones with opposite voltage, the system is a deflector. If the two poles on either side of a principal section are excited with opposite voltages as shown in FIG. 3, and the diametrically opposite poles with the same voltage, the deflector becomes a skew octopole. The contributions of such a skew lens to the aberrations at the focus have the simple form $$<x/a^2b>=-3Pos\ t^4$$

$$<x/b^3>=Pos\ t^4$$

$$<y/a\ b^2>=3Pos\ t^4$$

$$<y/a^3>=-Pos\ t^4 \quad (9)$$

where t is the throw distance from the lens to the final focus.

The second required skew compensator can be similarly combined with the mid-column deflectors 11, 13 if they are also oriented in skew fashion. As mentioned above, FIB columns are now aligned for dipole and quadrupole centering, and a final adjustment for 3rd-order aberration has to be added in this case.

Another place for a skew octopole 15 is between the two lenses 14, 16 of the quadrupole doublet. A 16-pole structure may be the simplest way to obtain the necessary 22.5-degree skew electrodes, although its 8 normal electrodes are not needed when the aberrations of the objective lens alone are to be nulled. The additional contributions of such a skew lens of voltage Hos to the aberrations at the focus have the form $$<x/a^2b>=3Hos(txMxd)^3(tyMyd)$$

$$<x/b^3>=-Hos(txMxd)(tyMyd)^3$$

$$<y/ab^2>=-3Hos(txMxd)(tyMyd)^3$$

$$<y/a^3>=Hos(txMxd)^3(tyMyd) \quad (10)$$

where (tx, ty) are the throw distances from the skew lens to the astigmatic line images formed by the upstream lens, and (Mxd, Myd) are the magnifications from these lines to the final focus.

The two skew octopoles may also be placed inside the two quadrupole lenses. In this instance an electric multipole lens is placed inside a magnetic quadrupole lens with four electrically grounded poles, which no longer serve simultaneously as electrodes. A simple mechanical design for this purpose consists of 12 or 16 parallel linear electrodes bonded to a flexible printed circuit membrane, which is rolled up and inserted into a non-magnetic vacuum tube placed inside the four poles of the magnetic quadrupole. There must be more than 8 electrodes in order to be able to introduce skew octopole fields. Similar structures can be made with a squirrel cage of electrodes supported on insulated supports inside the vacuum tube.

The electrodes of a multipole lens may be excited by applying voltages proportional to cos $n(t-t_o)$, where n is an integer, $0<t<360$ is the azimuthal angle of the electrode around the lens axis, and $t_o$ is a phase angle. These produce potentials with the same azimuthal dependence, combined with higher-order terms reflecting the influence of electrode shape and number of electrodes. Such voltages can be obtained using computers and commercially available integrated circuits for digital-to-analog conversion. Excitation with n=1 produces deflections. Excitation with n=2 provides the electric field with collinear forces to the quadrupole magnetic field produced by the magnetic poles, and produces a focusing lens of the Kelman-Yavor type. Excitation with n=3 produces hexapole potentials of use in compensation of the second-order aberrations which are also produced by construction tolerances and which prior art shows must be adjusted as a prerequisite to third-order work. Finally excitation with n=4 produces normal excitations when $t_o=0$ and skew excitations when $t_o=22.5$ degrees. These add to intrinsic and parasitic sources and produce normal octopole fields with strengths $U_{oc}$ and $D_{oc}$ and skew fields $U_{os}$ and $D_{os}$.

An advantage of placing skew octopoles inside the main lenses is the avoidance of fifth-order combination aberrations. These are generated when a ray which has been perturbed from its proper course by a parasitic octopole in a main lens traverses a second octopole and the deviations caused by the two separated lenses are combined. When third order aberrations are eliminated at their source, the combination aberrations also disappear. For this reason placing the skew octopole lenses inside the main quadrupole lenses may be preferred as the best mode.

Adjustment of the 3rd-order aberrations is effected by measuring them in place. For this purpose a fine filament can be mounted in the focal plane and in one of the principal sections, and another fine filament in the focal plane and the other principal section. Both filaments can be mounted on a single sliding carrier at 45 degrees to its axis, and either filament placed at the focus as desired by advancing the slider. One filament measures $x_3$ and is insensitive to $y_3$; the other measures $y_3$ and diacards $x_3$. Measurements of $y_3(a)$ are then made at a constant value of b. This can be done with four micrometer-positioned slit jaws located between the two lenses of the quadrupole doublet. Two micrometers are set to define a slot of fixed width db at fixed position b, and the two perpendicular micrometers are moved to define a rectangle of size (da,db) at position (a,b). At each setting the focused beam is swept across the filament, and the deflection $y_3$ required to reach the edge of the filament can be determined by the secondary electrons emitted as the beam hits the filament. Thereby a curve $y_3(a)$ can be measured at fixed b.

Figure 5:
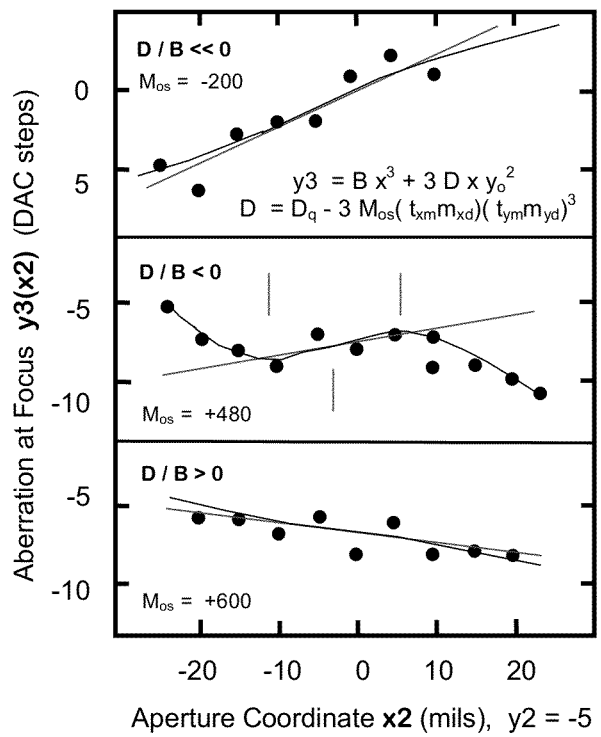
FIG. 5 shows measurement of aberrations in place

The measurements of $y_3(a)$ serve to adjust the two skew coefficients. It can be seen from FIG. 5 that in $$y_3-Eb^3=3Dab^2+3Ca^2b+Ba^3$$

the slope of the curve at a=0 is given by $dy_3/da=Db^2$, so iterative measurements and adjustments of the skew lens excitation Hos can be used to make D=0. After D has been nulled, there will remain a C $a^2b$ term which produces a parabolic curvature near a=0, and a term B $a^3$ which produces "cubic wings" that rise on one side at a>0 and fall on the other side at a<0. The cubic wings can be removed by adjusting the curve to be parabolic shape, with $y(a)=y(-a)$, using Pos or a mixture of Pos and Hos in a ratio computed to have no effect on D. The computed ratios are found by adding the effects of Eqs. (5, 6, 9, 10). Thus the two skew coefficients B, D are nulled.

Similar procedure can be followed for the $x_3$ (a) measurements to adjust the normal coefficients. The slope of this curve at a=0 is given $dx_3/da=3$ C $b^2$. It is incorrect procedure to adjust the slope using the skew octopoles, and it is good procedure to adjust Uoc because it has a greater effect than Doc. There should be no parabolic contribution since B has already been nulled. Then the cubic wing adjustment can be used to null A. For this adjustment Uoc and Doc should be adjusted in the ratio computed to have no effect on C, using Eq. (7). When A and C are nulled in this way, a value of Uoc close to zero will have been set. Then E will also be nearly zero because Uoc dominates in both Eqs. (7,8).

Figure 1:
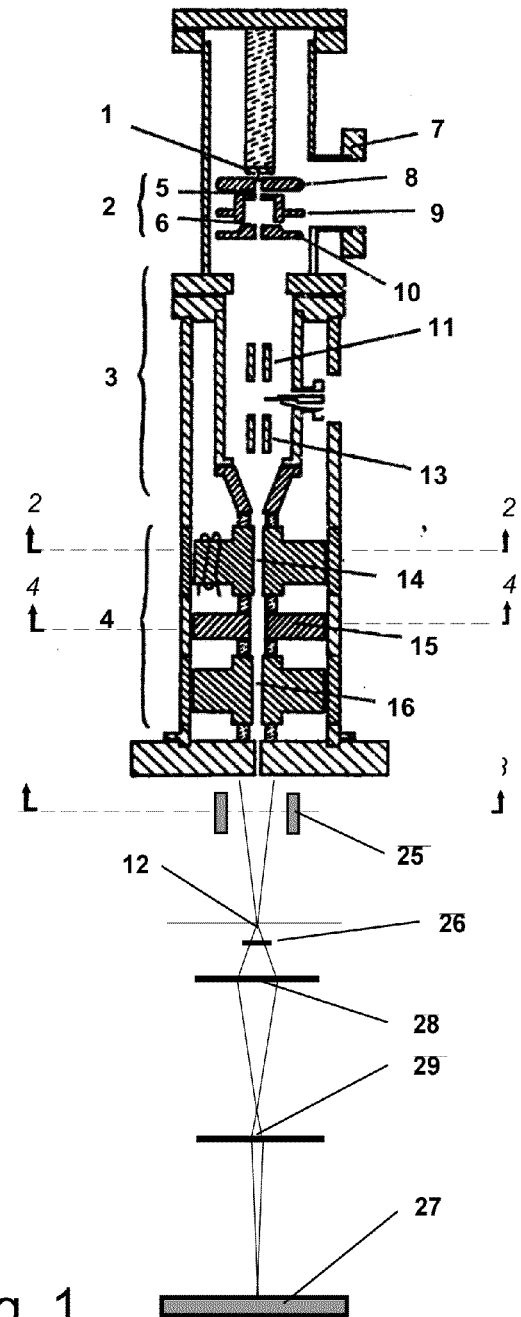
FIG. 1 shows an improved particle-optical column comprising a quadrupole objective lens, up to 3 external octopole lenses, a gridded specimen, projector lenses, and a position sensitive detector.
Figure 6:
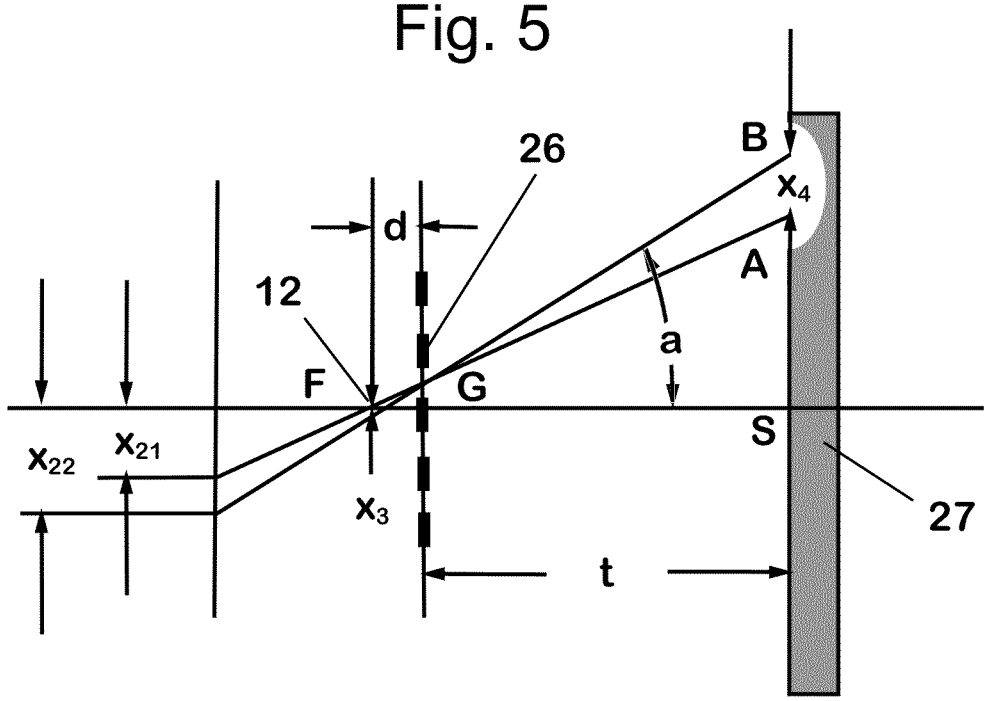
FIG. 6 illustrates the measurement of aberrations by simple grid-shadow testing.

Although it demonstrates principle, the procedure of micrometer adjustment is tedious and unsuitable as a best mode even for factory alignment. Any other suitable means of defining a region of the lens aperture specified by a final convergence angle (a,b) may be utilized, for example a finely collimated beam swept to an angle (a,b) by a pre-lens deflection system. In principle, a small aperture can be inserted upstream of the deflectors 11 and double deflection with slightly different angles in deflectors 11 and 13 can be used to define rays that appear to come from the LMIS 1. In practice with 4 KeV Ga ions, the aperture edges tend to scatter and multiple images are produced, so this method is recomended only for low-Z and high-energy ions. This method is recommended for a SEM-type setup, where the double deflection can be stepped rapidly by computer and the beam swept rapidly across a test specimen at each step. It is limited by the rate at which secondary particles made in the test specimen can be collected and counted. A faster method is to use the direct beam in a STEM-type setup as shown in FIG. 1., with the usual thin specimen absent from the focus 12, with an apertured specimen 26 located elsewhere than the focus 12, and with the particle beam continuing downstream of the focus 12 to a position-sensitive detector 27 which counts direct rather than scattered or secondary particles. A gridded specimen 26 is shown in FIG. 6. Such a thin grid with a series of holes can be placed to intersect the particle beam at any position along the beam axis except exactly at beam crossovers. The aberration coordinates are measured by the position sensitive detector 27 connected to an imaging system such as a computer or video camera. This technique has the advantage that it can be built into a production instrument for scanning ion microscopy, and can be used to set up the lenses in a factory and check them again in the field.

By a position-sensitive detector is meant any means of registering the (x,y) coordinates at which a particle strikes the surface of the detector. A simple example is a transparent window in a vacuum chamber with a scintillating film deposited on its interior surface, which shows bright spots where it is struck by ions which have traversed the open apertures of the grid. In the best mode, an electronic detector can be used. An electronic position-sensitive detector can be interfaced with a computer for automatic image processing, and algorithms can be devised to adjust electronic outputs to the lenses so as to produce successively better aberrations, as has been done in the prior art of electron optics. For low-energy particles used in FIB systems, a commercially available microchannel electron multiplier plate of the type originally used in night-vision equipment can be used. Particles striking one of the fine tubes in the plate cause an avalanche of secondary electrons in the tube. At the end of the tube the electrons strike a thin film of scintillator and cause it to emit light. The pattern of light is in turn imaged by a video camera.

The gridded specimen 26 typically is an electron microscope grid, which can have a rectangular array of grid bars spaced by 25 um, forming a series of square apertures each 20 um on a side. Wherever placed, a grid serves to form a bundle of rays, one for the center of each grid hole. Each ray has a different angle (a,b) and aberration (x3,y3) at the focal plane. A simple method is grid-shadow testing without projector lenses, in which the gridded specimen is inserted downstream of the focal plane and the position of rays transmitted by the grid is observed still further downstream.

The principle of grid-shadow tests is illustrated in FIG. 6 The probe-forming lens is diagrammed as a thin lens with a focal length f forming a focus 12 at focal point F An electron-microscope grid 26 is placed a distance d downstream of F, and a position sensitive detector 27 is placed a distance t downstream of the grid. The usual specimen holder of the apparatus can be utilized for this purpose, if it is fitted with a support to hold the grid at distance d from the focal plane of the apparatus. For a perfectly adjusted lens, a ray traverses the lens at aperture coordinate $x_{21}$, passes through the focal point, through the center of a grid aperture at G, and reaches the center of a spot on the detector at A. When the lens is changed from perfect adjustment so that an aberration $x_3$ is present, a different ray at coordinate $x_{22}$ in the lens aperture passes through the grid aperture and reaches the detector at point B, a distance $x_4$ from A. The distance that the spot moves thus measures the aberration at the final angle a. In a perfectly adjusted lens, all rays go through F, and the rectangular array of grid holes will make a rectangular array at the detector, with $x_4$=0 for all spots. Out of adjustment, the deviations $x_4$ display the aberrations $x_3$ near the focus.

When the grid bars are aligned with the principal sections, they correspond to the two fiducial wires of the micrometer tests. Thus adjusting Hos so that the slope $dy_4/da$=0 (as measured on center at a=0) will set D=0. Also adjusting Uoc so that a uniform spacing of apparent grid bars is seen in the x direction makes $dx_4/da$=0 and will set C=0.

The sensitivity of these measurements is sufficient to enable adjustments at dimensions much smaller than the mechanical tolerances in the lens pole locations. By similar triangles, $x_4$=(t/d) $x_3$, and a magnification of 100 can be obtained if d=2 mm and t=20 cm. A microchannel plate with 25 um spacing will thus be able to measure aberrations of 250 nanometers. If these measurements are made at large lens apertures, such as the $x_{22}$=0.5 mm available in present achromatic ion beam lenses, and the aperture is then stopped down to 50 um, aberrations should fall to 25 nm or smaller. Alternatively systems with t=1 meter could measure 50 nm at the edge of the lens and set 5 nm near the center.

Greater resolution in shorter space can be obtained by adding a two stage projector lens between the focal plane and the position-sensitive detector. Operating the system as a transmission microscope focuses rays from a point in the image plane near 12 onto the position-sensitive detector 27. For example two projector lenses 28, 29 with object distance 5 mm and image distance 50 cm would magnify aberrations by 10,000. In this mode, the perfectly adjusted beam comes to a single point at the focal plane and is imaged at the single point S on the detector. During adjustment a ray at x3(a) is imaged at x4(a), where x4 is measured from S. An array of spots will form around S, and adjustment serves to move all the spots into point S.

The grid technique is well known in electron microscopy, where it is complicated by electron diffraction. It is also known in high-energy ion microbeam work, where it has even been utilized with interleaved electric and magnetic quadrupole lenses. However previous uses have not involved octopole correction or needle-type sources.

Because of the effects of hysteresis in electromagnets, it is difficult to make fine adjustments of solely magnetic lenses. In the best mode this difficulty is alleviated by the prior art technique of utilizing the electric portion of the interleaved lenses when making fine adjustments. It can also be eliminated by using permanent magnets to excite the lens fields, at the expense of operation at a fixed particle energy.

It should be noted that the above method measures the aperture aberrations of the complete system while the earlier discussion treats only the achromatic quadrupole doublet, neglecting the ion source and condenser lens. Ion sources for FIB equipment typically comprise a needle-type source and extraction electrode followed by a round electrostatic condensing lens. Needle sources include wires wetted with a liquid metal, frequently gallium, or surrounded by a gas, such as helium. Very bright sources are obtained by using a single-crystal needle treated to form atomic-scale pyramids at its tip, which enables field ionization of ambient gas molecules at the summit of a single pyramid. If ions are produced by an ion gun with very small spherical aberration, only the aberrations produced by the interleaved lenses need to be adjusted. However for a needle source producing an intermediate image, the spherical aberration in the electrostatic lens 2 adds components to the final image with the form $$<x_3/a^3> = Mx^4 Cs,$$

$$<x_3/ab^2> = Mx2My2Cs$$

$$<y_3/a^2b> = Mx^2 My^2 Cs$$

$$<y_3/b^3> = My^4 Cs$$

Where (Mx, My) give the overall magnifications of the achromatic lens in its two sections and Cs is the spherical aberration coefficient of the round lens. For (Mx, My)=(0.14, 1.6), Cs=5 cm, and b=3.5 milliradians the largest aberration amounts to 1 micron.

These displacements can be counteracted by the normal octopoles in the lens, which act to create negative aperture aberration equal and opposite to the positive spherical aberration in the electrostatic lens. However there are only two adjustments Uoc and Doc, so that the three different displacements of Eqs. (11) at the final image cannot be simultaneously set to zero without using a normal octopole lens of strength Hoc between the quadrupoles. Instead of an extra lens, the normal octopole in the 16-pole mid-lens unit 15 may be used for this purpose. Equations for the three coefficients have the form $$Ao - (Uocp^{-4} - Doc)v^4 - Hoc(tx\ Mxd)^4 + Mx^4 Cs = 0$$

$$Co + (Uocp^{-2}q^{-2} - Doc)v^4 + Hoc(tx\ Mxd)^2(ty\ Myd)^2 + Mx^2 My^2 Cs/3 = 0$$

$$Eo - (Uoc\ q^{-4} - Doc)v^4 - Hoc(ty\ Myd)^4 + My^4 Cs = 0$$

where Ao, Co and Eo represent the sum of the intrinsic and uncorrected parasitic normal octopole coefficients of the objective lens 4 These coefficients have different values for any particular instrument, which are unknown beforehand because of random variation in the placement of lens electrodes Measurement of the aberrations in place can be used to satisfy all three of Eqs. (12) and thereby counteract the spherical aberration of the condenser lens 2. Measurement of y3(b) can be used to null the term E $b^3$, adjusting the sensitive Uoc or either of the other two strengths, thereby reducing the $y_3$ aberration, although the runout of rays in the y section makes this measurement more difficult. The slope $dy_3/db$ can be used to null the C $b^2$ a term so that C=0, altering Uoc and Hoc in the ratio necessary to keep E=0. Finally Doc and Hoc can be changed in the proper ratio to keep C=0 as computed from the second of Eqs. (12), with almost no effect on E because $q^{-4}$ is very large, and a dominant effect on A because the terms involving p and Mx are small. In this way a solution to the 3 simultaneous Eqs. 12 can be approximated during adjustments, in spite of the initially unknown values of Ao, Co and Eo.

When both skew and normal coefficients are nulled in this way, the doublet of interleaved lenses corrected with two skew and three normal octopoles simultaneously cancels the spherical and chromatic aberrations of the whole column.

It is recognized that modifications and variations of the invention disclosed herein will be apparent to those of skill in the art and it is intended that all such modifications and variations be included within the scope of the claims. Having described a best method, I wish to describe the invention by the following claims:

The invention claimed is:

1. An improved particle-optical column comprising a needle-type particle source, an extraction electrode, a condensing lens, and an objective lens system comprising two interleaved quadrupole lenses for forming a finely focused particle beam, wherein the improvement comprises
    two normal octopole correctors inside the objective lens system,
        comprising means to superimpose voltages of one polarity to all poles and of the opposite polarity to all electrodes of each interleaved lens, thereby forming normal octopole lenses within each interleaved lens; and
    two skew correctors, consisting of skew octopole lenses, situated at any location along the axis of the column,
        wherein the skew correctors are rotated 22.5 degrees about the axis with respect to the normal correctors and
    wherein the normal correctors and skew correctors function to compensate for intrinsic and parasitic third-order aberrations caused in each interleaved quadrupole lens.

2. An improved particle-optical column as in claim 1, in which the interleaved lenses are capable of operation at the critical ratio of electric to magnetic fields, such that they add no chromatic aberration to the positive chromatic aberration of all other particle-optical components.

3. An improved particle-optical column as in claim 1 wherein at least one of the normal octopole lens fields is formed by an interleaved quadrupole lens consisting of 4 electrodes and 4 insulated magnetic poles.

4. An improved particle-optical column as in claim 1 wherein the improvement further comprises
    an apertured specimen intercepting the particle beam at any distance along the beam axis
    and a detector capable of measuring the position at which particles strike its surface located downstream of the focal plane of the column,
    for the purpose of measuring the aberrations of the column.

5. An improved particle-optical column comprising a needle-type particle source, an extraction electrode, a condensing lens, and an objective lens system comprising two interleaved quadrupole lenses for forming a finely focused particle beam, wherein the improvement comprises
    two normal octopole correctors inside the objective lens system,
        comprising means to superimpose voltages of one polarity to all poles and of the opposite polarity to all electrodes of each interleaved lens,
        thereby forming normal octopole lenses within each interleaved lens; and
    two skew correctors, consisting of skew octopole lenses, situated at any location along the axis of the column,
        wherein the skew correctors are rotated 22.5 degrees about the axis with respect to the normal correctors; and
    a third ancillary normal octopole lens, wherever located along the axis of the column; and wherein the normal correctors and skew correctors function to compensate for intrinsic and parasitic 3rd-order aperture aberrations of the entire column.

6. An improved particle-optical column as in claim 5, in which the interleaved lenses are capable of operation at the critical ratio of electric to magnetic fields, such that the negative chromatic aberration of the interleaved lenses cancels the positive chromatic aberration of all other particle-optical components, and the spot diameter is substantially independent of small changes in the particle energy.

7. An improved particle-optical column as in claim 5 wherein at least one of the normal octopole lens fields is formed by an interleaved quadrupole lens consisting of 4 electrodes and 4 insulated magnetic poles.

8. An improved particle-optical column as in claim 5 wherein the ancillary normal octopole and one of the skew octopoles are combined into a single 16-pole lens.

9. An improved particle-optical column as in claim 5 wherein the improvement further comprises an apertured specimen intercepting the particle beam at any distance along the beam axis and a detector capable of measuring the position at which particles strike its surface located downstream of the focal plane of the column, for the purpose of measuring the aberrations of the column.

10. An improved particle-optical column comprising a needle-type particle source, an extraction electrode, a condensing lens, and an objective lens system comprising two magnetic quadrupole lenses for forming a finely focused particle beam, wherein the improvement comprises an electric multipole lens structure placed inside the poles of each magnetic lens, functioning simultaneously as an electric quadrupole lens, a normal octopole corrector lens, and a skew corrector octopole lens, wherein the skew lenses are rotated 22.5 degrees about the axis with respect to the normal fields; and wherein the normal correctors and skew correctors function to compensate for intrinsic and parasitic third-order aberrations caused in each quadrupole lens.

11. An improved particle-optical column as in claim 10 and a third normal ancillary corrector located between the magnetic quadrupoles, wherein the three normal correctors and the two skew correctors function to compensate for intrinsic and parasitic third-order aberrations of the entire column.

12. A method comprising the steps of providing the particle-optical column of claim 1, and adjusting the lenses to correct spherical and chromatic aberrations of a finely focused particle beam.

13. The method of claim 12 further comprising the step of determining aberrations in an image made by the particles in a detector capable of measuring the position at which particles strike its surface.

14. The method of claim 13 further comprising the steps of placing an apertured specimen at any position along the beam axis, and utilizing the image formed by particles which have passed through apertures in the specimen.

15. The method of claim 14 further comprising the steps of utilizing a gridded specimen which has a rectangular array of apertures in straight lines equally spaced from each other, and adjusting the lenses of the column so that the image contains a region with a substantially rectangular array of spots in straight lines parallel to each other.

16. The method of claim 14 further comprising the steps of utilizing a column comprising one or more projector lenses located between the focal plane and the position-sensitive detector, setting the projector lenses to make an image of the focal plane at the position-sensitive detector, thereby displaying aberrations as an array of spots at the detector, and adjusting the lenses of the column so that the array coalesces into a single spot.

17. A method of compensating for intrinsic and parasitic third order aberrations comprising the steps of providing the improved particle-optical column of claim 5;

using the improved particle-optical column to produce a finely focused particle beam; and adjusting the normal correctors, the skew correctors, and the third ancillary normal octopole lens to correct spherical and chromatic aberrations of the finely focused particle beam.

18. The method of claim 17 further comprising the step of determining aberrations in an image made by the particles in a detector capable of measuring the position at which particles strike its surface.

19. The method of claim 18 further comprising the steps of placing an apertured specimen at any position along the beam axis, and utilizing the image formed by particles which have passed through apertures in the specimen.

20. The method of claim 19 further comprising the steps of utilizing a gridded specimen which has a rectangular array of apertures in straight lines equally spaced from each other, and adjusting the lenses of the column so that the image contains a region with a substantially rectangular array of spots in straight lines parallel to each other.

21. The method of claim 20 further comprising the steps of utilizing a column comprising one or more projector lenses located between the focal plane and the position-sensitive detector, and setting the projector lenses to make an image of the focal plane at the position-sensitive detector thereby displaying aberrations as an array of spots at the detector, and adjusting the lenses of the column so that the array coalesces into a single spot.

* * * * *